(12) United States Patent
Isaka et al.

(10) Patent No.: US 9,492,872 B2
(45) Date of Patent: Nov. 15, 2016

(54) SURFACE-MODIFIED, WC-BASED CEMENTED CARBIDE MEMBER, HARD-COATED, WC-BASED CEMENTED CARBIDE MEMBER, AND THEIR PRODUCTION METHODS

(75) Inventors: Masakazu Isaka, Yasu-shi (JP); Fumihiro Fujii, Narita (JP)

(73) Assignee: Hitachi Tool Engineering, Ltd., Tokyo (JP)

( * ) Notice: Subject to any disclaimer, the term of this patent is extended or adjusted under 35 U.S.C. 154(b) by 20 days.

(21) Appl. No.: 14/236,510

(22) PCT Filed: Jul. 30, 2012

(86) PCT No.: PCT/JP2012/069358
§ 371 (c)(1),
(2), (4) Date: Jan. 31, 2014

(87) PCT Pub. No.: WO2013/018768
PCT Pub. Date: Feb. 7, 2013

(65) Prior Publication Data
US 2014/0170432 A1    Jun. 19, 2014

(30) Foreign Application Priority Data

Aug. 1, 2011 (JP) ................................. 2011-168657

(51) Int. Cl.
| | |
|---|---|
| C23C 14/06 | (2006.01) |
| B23B 27/14 | (2006.01) |
| C23C 14/02 | (2006.01) |
| C23C 14/32 | (2006.01) |
| B23B 51/00 | (2006.01) |
| B23C 5/16 | (2006.01) |

(52) U.S. Cl.
CPC ............. *B23B 27/148* (2013.01); *B23B 51/00* (2013.01); *B23C 5/16* (2013.01); *C23C 14/022* (2013.01); *C23C 14/027* (2013.01); *C23C 14/0641* (2013.01); *C23C 14/325* (2013.01); *Y10T 428/12014* (2015.01)

(58) Field of Classification Search
USPC .................. 51/307, 309; 428/697, 698, 699; 204/192.15, 192.16
See application file for complete search history.

(56) References Cited

U.S. PATENT DOCUMENTS 7,410,707 B2 * 8/2008 Fukui et al. .................. 428/697
7,531,212 B2    5/2009 Kohara et al.
(Continued)

FOREIGN PATENT DOCUMENTS

| JP | 06-74497 B2 | 9/1994 |
| JP | 10-251840 | * 9/1998 |

(Continued)

OTHER PUBLICATIONS

International Search Report of PCT/JP2012/069358 dated Oct. 23, 2012.
(Continued)

*Primary Examiner* — Archene Turner
(74) *Attorney, Agent, or Firm* — Sughrue Mion, PLLC

(57) ABSTRACT

The ion bombardment of Cr, etc. onto a surface of a WC-based cemented carbide substrate in a nitrogen-based gas forms a modified phase having a bcc structure on the substrate surface, and a hard coating containing at least Cr formed thereon has high adhesion to the substrate by the modified phase.

8 Claims, 6 Drawing Sheets

(56) References Cited

U.S. PATENT DOCUMENTS

| | | |
|---|---|---|
| 7,955,691 B2 | 6/2011 | Moronuki et al. |
| 8,323,807 B2 | 12/2012 | Kohara et al. |
| 8,597,797 B2 | 12/2013 | Sekiya et al. |
| 2005/0276990 A1 | 12/2005 | Kohara et al. |
| 2009/0011225 A1 | 1/2009 | Moronuki et al. |
| 2009/0173625 A1 | 7/2009 | Kohara et al. |
| 2009/0214894 A1 | 8/2009 | Kohara et al. |
| 2010/0295251 A1 | 11/2010 | Sekiya et al. |

FOREIGN PATENT DOCUMENTS

| | | |
|---|---|---|
| JP | 2004332005 A | 11/2004 |
| JP | 2007-169698 A | 7/2007 |
| JP | 2008-173751 A | 7/2008 |
| JP | 2009-220260 A | 10/2009 |
| JP | 4535249 B2 | 9/2010 |
| JP | 4590940 B2 | 12/2010 |
| WO | 2008/059791 A1 | 5/2008 |
| WO | 2012/146311 * | 11/2012 |

OTHER PUBLICATIONS

Communication dated Sep. 8, 2015 from the Japanese Patent Office issued in corresponding application No. 2013-526916.

* cited by examiner

US 9,492,872 B2

SURFACE-MODIFIED, WC-BASED CEMENTED CARBIDE MEMBER, HARD-COATED, WC-BASED CEMENTED CARBIDE MEMBER, AND THEIR PRODUCTION METHODS

CROSS REFERENCE TO RELATED APPLICATIONS

This is a National Stage of International Application No. PCT/JP2012/069358 filed Jul. 30, 2012 (claiming priority based on Japanese Patent Application No. 2011-168657 filed Aug. 1, 2011), the contents of which are incorporated herein by reference in their entirety.

FIELD OF THE INVENTION

The present invention relates to a hard-coated, WC-based cemented carbide member with a high-adhesion coating and suitable for a hard-coated tool, a surface-modified, WC-based cemented carbide member used therefor, and their production methods.

BACKGROUND OF THE INVENTION

When hard coatings are formed on WC-based cemented carbide substrates by a physical vapor deposition method, the hard coatings are required to have high adhesion strength to the substrates. To improve adhesion strength between substrates and hard coatings, various methods have been proposed. JP 6-74497 B discloses a method for forming a hard ceramic coating by conducting the ion bombardment of metals on a substrate surface in vacuum, and then a melt deposition method. Also, Japanese Patents 4535249 and 4590940 disclose methods of ion-bombarding cemented carbide substrates of cutting tools with Cr in vacuum, and then forming predetermined hard coatings. Coatings having somewhat high adhesion strength are obtained by these methods, in which metal ions are bombarded in vacuum, but they fail to meet increasingly higher demand to the performance of cutting tools, etc., and further improvement is required.

JP 2009-220260 A discloses a method for producing a hard-coated tool by ion-bombarding metal Ti to a surface of a WC-based cemented carbide substrate in an Ar- or $N_2$-based atmosphere to form a W-modified phase, forming a carbide phase immediately thereon, and forming a hard coating immediately on this carbide phase. However, the ion bombardment of Ti results in the formation of a decarburized phase under a modified phase, resulting in insufficient adhesion strength to a hard coating. Also, TiC formed on the modified phase does not have sufficient impact resistance, resulting in low adhesion strength.

OBJECT OF THE INVENTION

Accordingly, an object of the present invention is to provide a long-life, hard-coated, WC-based cemented carbide member with a hard coating having adhesion improved without forming a decarburized phase, a surface-modified, WC-based cemented carbide member used therefor, and their production methods.

DISCLOSURE OF THE INVENTION

The surface-modified, WC-based cemented carbide member of the present invention comprises a modified phase having a bcc structure, which is formed on a surface of a WC-based cemented carbide substrate, the modified phase having a metal composition represented except for inevitable impurities by the following general formula:

$$W_{100-x-y}M_xCo_y (\text{\% by mass}),$$

wherein M is at least one element selected from the group consisting of Cr, V, Ni, Fe and Mn, Cr being indispensable and occupying 70% or more by mass of the entire element M, and (100-x-y), x and y expressing the amounts (% by mass) of W, the element M and Co are numbers meeting the conditions of $80 \le 100-x-y \le 95$, $5 \le x \le 20$, and $0.1 \le y \le 3$, respectively.

The hard-coated, WC-based cemented carbide member of the present invention comprises a hard coating containing at least Cr, which is formed on a surface of a WC-based cemented carbide substrate via a modified phase having a bcc structure, the modified phase having a metal composition represented except for inevitable impurities by the following general formula:

$$W_{100-x-y}M_xCo_y (\text{\% by mass}),$$

wherein M is at least one element selected from the group consisting of Cr, V, Ni, Fe and Mn, Cr being indispensable and occupying 70% or more by mass of the entire element M, and (100-x-y), x and y expressing the amounts (% by mass) of W, the element M and Co are numbers meeting the conditions of $80 \le 100-x-y \le 95$, $5 \le x \le 20$, and $0.1 \le y \le 3$, respectively.

The formation of the modified phase on a surface of the WC-based cemented carbide substrate increases adhesion strength between the WC-based cemented carbide substrate and the hard coating containing at least Cr, thereby providing a long-life, hard-coated, WC-based cemented carbide member highly resistant to the peeling of the hard coating, and suitable for a cutting tool.

The crystal lattice fringes of the modified phase are at least partially continuous with those of the WC-based cemented carbide substrate in their interface (because of epitaxial growth). Accordingly, the modified phase and the substrate have high adhesion strength. This effect is remarkable particularly when the element M is only Cr.

The method of the present invention for producing a surface-modified, WC-based cemented carbide member comprises ion-bombarding an element M, which is at least one element selected from the group consisting of Cr, V, Ni, Fe and Mn, Cr being indispensable and occupying 70% or more by mass of the entire element M, onto a surface of the WC-based cemented carbide substrate, in a nitrogen gas, or in a mixed gas of a nitrogen gas and an inert gas, the flow rate of the nitrogen gas being 50% or more of that of the mixed gas, under such conditions that the pressure of the gas is 0.03-2 Pa, and that the temperature of the substrate is 650-850° C., thereby forming a modified phase having a bcc structure.

The method of the present invention for producing a hard-coated, WC-based cemented carbide member comprises (1) ion-bombarding an element M, which is at least one element selected from the group consisting of Cr, V, Ni, Fe and Mn, Cr being indispensable and occupying 70% or more by mass of the entire element M, onto a surface of the WC-based cemented carbide substrate, in a nitrogen gas, or in a mixed gas of a nitrogen gas and an inert gas, the flow rate of the nitrogen gas being 50% or more of that of the mixed gas, under such conditions that the pressure of the gas is 0.03-2 Pa, and that the temperature of the substrate is 650-850° C., thereby producing a surface-modified, WC-based cemented carbide member provided with a modified phase having a bcc structure, and (2) forming a hard coating containing at least Cr on a surface of the modified phase.

The carbide-forming free energy Em of the element M used for ion bombardment and the carbide-forming free energy Ew of W preferably meet the condition of Em/Ew<3 at 800° C. This prevents the formation of a decarburized phase, which acts to decrease the adhesion strength of the hard coating.

The hard coating preferably contains Cr, Al and N.

DESCRIPTION OF THE PREFERRED EMBODIMENTS

Figure 1:
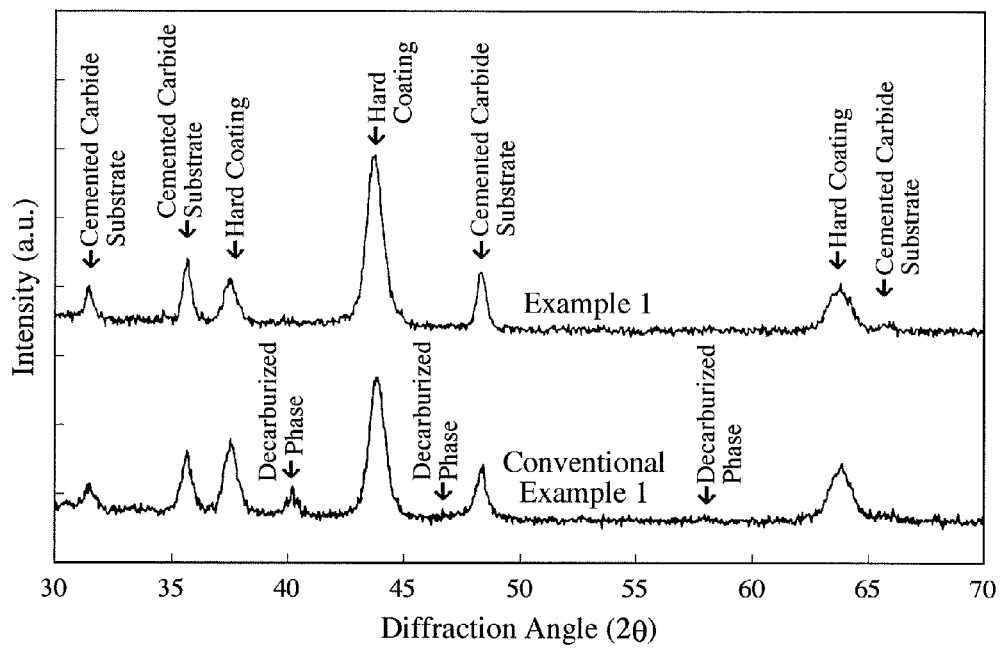
FIG. 1 is a graph showing the X-ray diffraction patterns of the hard-coated tool surfaces of Example 1 and Conventional Example 1.

[1] Composition (A) Composition of WC-Based Cemented Carbide Substrate

The WC-based cemented carbide substrate is preferably constituted by tungsten carbide (WC) particles, and a binder phase made of Co or a Co-based alloy. The binder phase is preferably 1-13.5% by mass, more preferably 3-13% by mass. When the binder phase is less than 1% by mass, the substrate has insufficient toughness. On the other hand, when the binder phase is more than 13.5% by mass, the substrate has insufficient hardness (wear resistance).

(B) Composition of Modified Phase

The modified phase formed by the ion bombardment of the element M comprises W, an element M and Co as indispensable elements except for carbon and inevitable impurities, the element M being at least one element selected from the group consisting of Cr, V, Ni, Fe and Mn, Cr being indispensable and occupying 70% or more by mass of the entire element M. To obtain a modified phase having high adhesion strength, the element M is preferably only Cr. When the element M comprises at least one element selected from the group consisting of V, Ni, Fe and Mn, the percentage of Cr should be 70% or more by mass of the entire element M. When the percentage of Cr is less than 70% by mass of the entire element M, the modified phase has low adhesion strength. The percentage of Cr is preferably 75% or more by mass, more preferably 80% or more by mass, of the entire element M.

Among the elements constituting the modified phase, the measurement data of carbon have large unevenness, which occurs by the influence of carbon contained in the substrate. Accordingly, the composition of the modified phase is expressed by a metal composition herein. The metal composition of the modified phase is represented except for inevitable impurities by the following general formula:

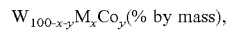

$$W_{100-x-y}M_xCo_y (\% \text{ by mass}),$$

wherein M is at least one element selected from the group consisting of Cr, V, Ni, Fe and Mn, Cr being indispensable and occupying 70% or more by mass of the entire element M, and (100-x-y), x and y expressing the amounts (% by mass) of W, the element M and Co are numbers meeting the conditions of $80 \leq 100-x-y \leq 95$, $5 \leq x \leq 20$, and $0.1 \leq y \leq 3$, respectively. This metal composition range ensures high adhesion strength, providing a hard-coated, WC-based cemented carbide member with a long life.

To increase adhesion strength between the WC-based cemented carbide substrate and the hard coating, the amount (100-x-y) of W is preferably 82-92% by mass, more preferably 85-90% by mass. The amount (x) of the element M is preferably 7-18% by mass, more preferably 10-14% by mass. The amount (y) of Co is preferably 0.2-2% by mass, more preferably 0.3-1% by mass.

(C) Composition of Hard Coating

To increase adhesion strength to the modified phase, the hard coating should contain at least Cr, a main component of the modified phase. The hard coating preferably further contains Al and N. The hard coating containing Cr, Al and N may be a single-layer coating selected from the group consisting of AlCrN, AlCrNC, AlCrNCB, AlCrSiN, AlCrTiN, AlCrTiNC, AlCrSiNC and AlCrSiNCB, or a multi-layer coating comprising two or more of them. In the case of an AlCrN coating, the composition of metal components is such that the amount of Cr is preferably 20-40 atomic %, more preferably 25-35 atomic %, and that the amount of Al is preferably 80-60 atomic %, more preferably 75-65 atomic %, the total amount of Al and Cr being 100 atomic %. In the case of coatings of AlCrNC and AlCrNCB, their metal compositions may be the same as in the AlCrN coating, and the composition of non-metal components is such that the amount of C is preferably 20 atomic % or less, more preferably 15 atomic % or less, and that the amount of B is preferably 10 atomic % or less, more preferably 5 atomic % or less, the total amount of N, C and B being 100 atomic %. In the case of coatings of AlCrSiN, AlCrTiN, AlCrTiNC, AlCrSiNC and AlCrSiNCB, their metal compositions are such that both Si and Ti are preferably 20 atomic % or less, more preferably 10 atomic % or less, the total amount of Al, Cr, Si and Ti being 100 atomic %. These hard coatings can be formed by a CVD or PVD method.

Because both of the modified phase and the hard coating contain Cr, their crystal lattice fringes tend to be at least partially continuous, so that they have high affinity and thus high adhesion strength.

[2] Structure (A) Structure of Modified Phase

The modified phase has a bcc structure. Though the modified phase preferably has only a bcc structure, it would have high adhesion strength even if it contained other crystal structures, as long as the bcc is a main structure. Other crystal structures in the modified phase include an fcc structure and an hcp structure. The crystal structure of the modified phase is determined by an electron diffraction pattern as described later. The term "being a main structure" used herein means that when electron diffraction images of the modified phase are obtained in pluralities of fields, the electron diffraction pattern of the bcc structure is observed in half or more numbers of fields among all the fields.

Because the crystal lattice fringes of the modified phase having a bcc structure are at least partially continuous with those of the WC-based cemented carbide substrate, namely, because the modified phase having a bcc structure has epitaxially grown on a surface of the WC-based cemented carbide substrate, the modified phase has extremely high adhesion strength to the substrate. The observation of an interface structure between the WC-based cemented carbide substrate and the modified phase has revealed that extremely improved adhesion strength is obtained when epitaxial growth is observed in 50% or more, preferably 70% or more, of the lattice fringes of the modified phase.

The average thickness of the modified phase is preferably 0.1-20 nm, more preferably 0.5-10 nm. When the average thickness of the modified phase is less than 0.1 nm, an effect of improving adhesion strength is not obtained. On the other hand, even when the average thickness is more than 20 nm, the effect would not be further improved, resulting in only decrease in productivity.

In the present invention, the formation of the modified phase is not accompanied by the formation of a decarburized phase (decarburized WC phase). For example, when a conventional ion bombardment of Ti is conducted to the WC-based cemented carbide substrate, the surface temperature of the substrate exceeds 800° C., resulting in the decarburization of a WC phase, forming a decarburized phase with a small C content, such as $Co_3W_3C$, $Co_6W_6C$, etc. Because the decarburized phase is extremely brittle, the peeling of the hard coating starts from cracks generated in the decarburized phase, when used as a tool for high-load cutting such as high-feed cutting. As a result, the tool is damaged and abnormally worn, resulting in a short life. In the present invention, on the other hand, a decarburized phase is not formed on the substrate, providing a hard-coated, WC-based cemented carbide member with a long life.

(B) Structure of Hard Coating

The hard coating formed immediately on the modified phase mainly has a fcc structure, whose crystal lattice fringes are at least partially continuous with those of the modified phase having a bcc structure in their interface. Namely, the hard coating epitaxially grows at least partially on a surface of the modified phase. Accordingly, the hard coating has high adhesion strength to the modified phase. The observation of an interface structure between the modified phase and the hard coating has revealed that extremely improved adhesion strength is obtained when 50% or more, preferably 70% or more, of the lattice fringes in at least the interface are epitaxially grown.

[3] Production Method of Hard-Coated, WC-Based Cemented Carbide Member

The hard-coated, WC-based cemented carbide member can be produced by an ion-cleaning step by argon gas bombardment, a step of forming a modified phase by the ion bombardment of the element M, and a step of forming the hard coating. In the ion bombardment, an arc discharge vaporization source is preferably used, but metal ion bombardment with a sputtering vaporization source is also usable.

(A) Gas Bombardment

Though not indispensable, the gas bombardment is preferably conducted before the ion bombardment. The gas bombardment comprises heating a WC-based cemented carbide substrate fixed to a holder in a film-forming apparatus to about 500° C., and ionizing an argon gas, for example, by a filament, with bias voltage P1 of −800 V to −200 V applied to the substrate, and an argon gas flowing in the apparatus at pressure of 0.01-4 Pa, thereby impinging ions onto the substrate for cleaning.

(B) Ion Bombardment (1) Target

The element M used in the ion bombardment should be Cr alone, or a combination of Cr and at least one element selected from the group consisting of V, Ni, Fe and Mn, in which Cr is 70% or more by mass of the entire element M. Accordingly, The target of the element M is composed, for example, of metal Cr alone, or an Cr-containing alloy such as a Cr—V alloy, a Cr—Ni alloy, a Cr—Fe alloy, a Cr—Ni—Fe alloy, a Cr—V—Fe alloy, etc. The carbide-forming free energy Em of the element M and the carbide-forming free energy Ew of W meet the condition of Em/Ew<3 at 800° C. It has been found that this provides a modified phase of a bcc structure having high adhesion strength to the WC-based cemented carbide substrate, without forming a decarburized phase.

A metal such as Ti, which has an extremely smaller carbide-forming free energy than that of W, removes C from WC to form carbide, when its ions are bombarded onto a surface of the WC-based cemented carbide substrate. WC deprived of C forms a decarburized phase (embrittled phase) such as $Co_3W_3C$, $Co_6W_6C$, etc. The brittle decarburized phase largely decreases the adhesion strength of the hard coating, resulting in the peeling of the hard coating. The condition for preventing this phenomenon is Em/Ew<3 at 800° C., and an element meeting this condition is the element M. The element M meets preferably 0.1≤Em/Ew≤2.5, more preferably 0.2≤Em/Ew≤2.

(2) Temperature of Substrate

The temperature of the WC-based cemented carbide substrate should be 650-850° C., and is preferably 700-800° C., during the ion bombardment. At lower than 650° C., a substrate surface is not activated by the ion bombardment. On the other hand, at higher than 850° C., WC is likely decarburized, forming an embrittled phase. The substrate temperature is measured by a thermo-couple embedded in a holder provided in the film-forming apparatus for supporting the substrate.

(3) Gas

A gas used in the ion bombardment is a nitrogen gas alone, or a mixed gas of a nitrogen gas and an inert gas, except for inevitable impurities, and a nitrogen gas alone is preferable. The inert gas is at least one selected from the group consisting of Ar, Kr, Xe and Ne. In the case of a mixed gas, a volume ratio of the flow rate of the nitrogen gas to that of the mixed gas is preferably 50% or more, more preferably 70% or more. With 50% or more of a nitrogen gas flow rate, high-density plasma is generated on the ion-bombarding target, resulting in improved ionization efficiency, thereby enabling high-efficiency ion bombardment. In the case of the mixed gas, pluralities of gases at predetermined flow rates, or gases mixed at predetermined flow rate ratios in advance may be supplied to the apparatus, as long as the flow rate ratio of a nitrogen gas is 50% or more by volume.

(4) Time

Though not particularly restricted, the ion bombardment time is preferably 3-30 minutes, more preferably 5-20 minutes. The treatment time of less than 3 minutes fails to provide a sufficient modifying effect, and the treatment time exceeding 30 minutes is not practically efficient.

(5) Bias Voltage

Bias voltage P2 applied to the substrate during the ion bombardment is preferably −1500 V to −600 V, more preferably −1000 V to −600 V. P2 outside the range of −1500 V to −600 V fails to provide the ion bombardment with a sufficient modifying effect.

(6) Gas Pressure

The above gas is caused to flow in the film-forming apparatus during the ion bombardment, such that pressure therein is 0.03-2 Pa. The atmosphere pressure of less than 0.03 Pa fails to provide a sufficient effect in the ion bombardment, and the atmosphere pressure exceeding 2 Pa makes bias current to the substrate unstable, failing to conduct stable ion bombardment. The atmosphere pressure is preferably 0.04-1.5 Pa, more preferably 0.05-1 Pa.

(7) Discharge Current

Discharge current of the arc discharge vaporization source is preferably 80-200 A, more preferably 100-150 A, during the ion bombardment. The discharge current outside the range of 80-200 A makes arc discharge unstable.

(C) Formation of Hard Coating

The hard coating formed immediately on the modified phase should contain Cr used for the ion bombardment to obtain high adhesion, and preferably contains Cr, Al and N. It is preferable to form the hard coating continuously in the same film-forming apparatus as for the modified phase. The film-forming apparatus is preferably an arc ion plating (AIP) apparatus. Conditions for forming the hard coating are preferably a substrate temperature of 450-850° C., bias voltage of −150 V to −30 V, discharge current of 100-200 A, and the treatment time of 10-240 minutes in an atmosphere gas (for example, nitrogen gas, etc.) at pressure of 0.5-10 Pa. The resultant hard coating is cooled to 200° C. or lower, and the hard-coated, WC-based cemented carbide member (tool, etc.) is taken out of the film-forming apparatus.

The hard-coated, WC-based cemented carbide members of the present invention are suitably used as hard-coated tools or dies.

The present invention will be explained in more detail referring to Examples below without intention of restricting the present invention thereto. Taking tools for example, explanation will be made in Examples, but it should of course be noted that the hard-coated, WC-based cemented carbide members of the present invention are not limited to tools.

Example 1

Figure 9:
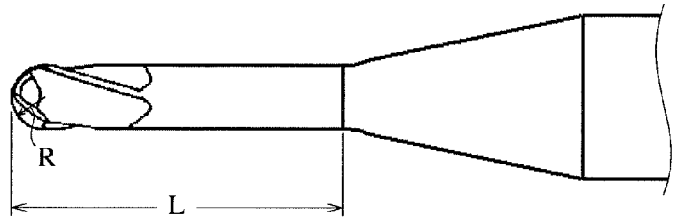
FIG. 9 is a partial side view showing a two-flute ball end mill substrate made of WC-based cemented carbide used in Examples, etc.

A two-flute ball end mill substrate (ball radius R: 1.0 mm, and under-neck length L: 10 mm) having the shape shown in FIG. 9, which was formed by WC-based cemented carbide comprising 8.0% by mass of Co, and 0.3% by mass of TaC, the balance being WC and inevitable impurities, was set in an AIP apparatus, to carry out the following steps.

(1) Heating Step

After the AIP apparatus was evacuated to $10 \times 10^{-3}$ Pa or less, evacuation was continued to a pressure of $5 \times 10^{-3}$ Pa while heating the substrate to 500° C. by a heater.

(2) Gas Bombardment Step

An argon gas was supplied to the AIP apparatus to an argon gas atmosphere of 2.0 Pa while heating the substrate at 500° C., and bias voltage of −600 V was applied to the substrate to carry out the argon gas bombardment of the substrate for 15 minutes.

(3) Metal Cr Ion Bombardment Step

After the supply of an argon gas was stopped, a nitrogen gas was caused to flow in the AIP apparatus at a flow rate of 20 sccm to provide an nitrogen gas atmosphere having a pressure of 0.08 Pa. With discharge current of 120 A supplied to a metal Cr target attached to the arc discharge vaporization source to generate arc discharge, bias voltage of −1000 V applied to the substrate, and the substrate temperature elevated to 744° C., the bombardment of Cr ions was conducted for 15 minutes to produce a surface-modified, WC-based cemented carbide member.

(4) Step of Forming Hard Coating

After the supply of discharge current to metal Cr was stopped, the flow rate of a nitrogen gas was adjusted to a pressure of 3 Pa in the AIP apparatus. Discharge current of 150 A was supplied to a target having a composition of $Al_{70}Cr_{30}$ by atomic % (hereinafter referred to as $Al_{70}Cr_{30}$ target), which was attached to the arc discharge vaporization source, to generate arc discharge. With bias voltage of −100 V applied to the substrate, and the substrate temperature elevated to 744° C. in an initial coating stage, a hard-coated tool comprising a hard coating having a composition of $(Al_{70}Cr_{30})N$ (atomic %) and an average thickness of 3 μm was obtained.

(5) Measurement

The X-ray diffraction pattern of the hard-coated tool surface is shown in FIG. 1. As is clear from FIG. 1, the hard-coated tool of this Example did not have X-ray diffraction peaks of the decarburized phase.

Figure 2:
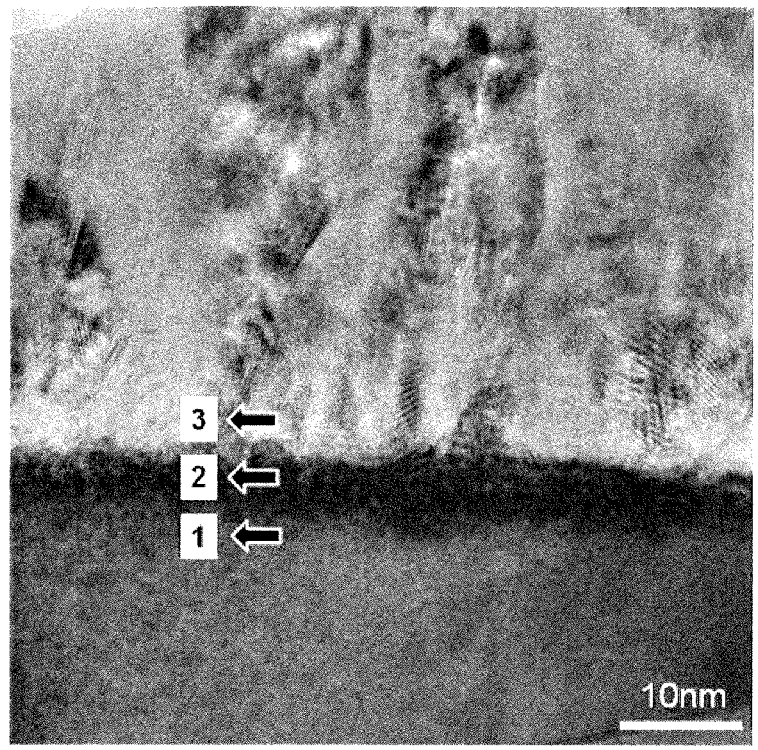
FIG. 2 is a transmission electron photomicrograph (TEM photograph) showing a cross section including a modified phase of the hard-coated tool of Example 1.

FIG. 2 is a TEM photograph of a cross section of this hard-coated tool. In FIG. 2, 1 represents a substrate, 2 represents a modified phase, and 3 represents a hard coating. It is clear from FIG. 2 that a modified phase 2 as thick as several nanometers was formed on a surface of the substrate 1.

Figure 3:
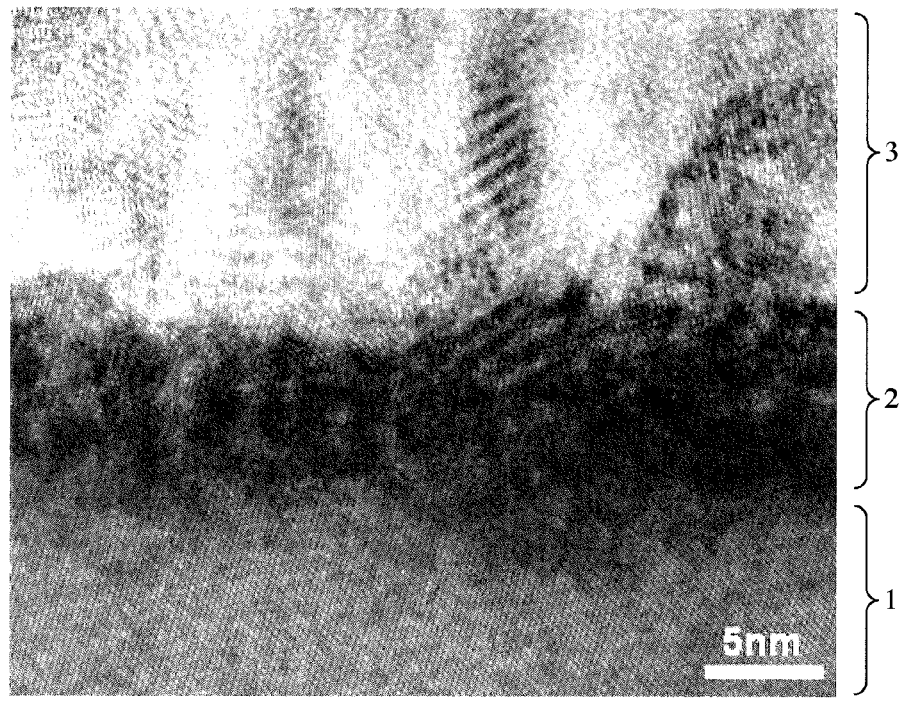
FIG. 3 is a TEM photograph with higher magnification of part of FIG. 2.
Figure 4:
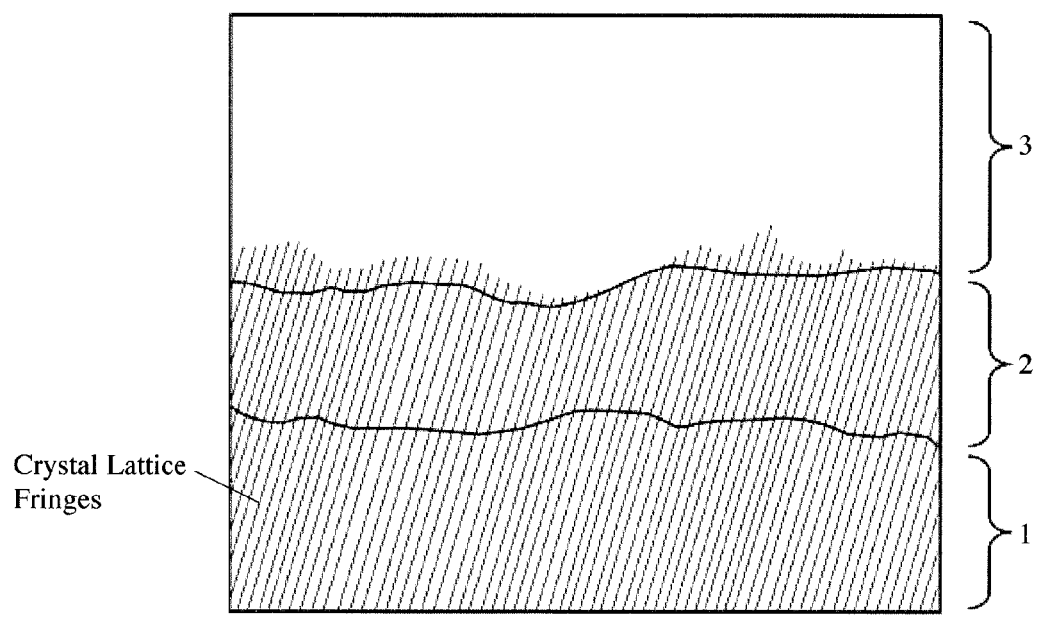
FIG. 4 is a schematic view corresponding to the TEM photograph of FIG. 3.

FIG. 3 is a TEM photograph showing the substrate 1, the modified phase 2, the hard coating 3, and their interfaces in this hard-coated tool, and FIG. 4 is a schematic view showing the lattice fringes in FIG. 3. It is clear from FIG. 3 that the crystal lattice fringes of the substrate 1 were substantially 100% continuous with those of the modified phase 2 in their interface. It is also clear from FIGS. 3 and 4 that the crystal lattice fringes of the modified phase 2 were 92% continuous with those of the hard coating 3 in their interface, though they were partially not continuous.

Figure 5:
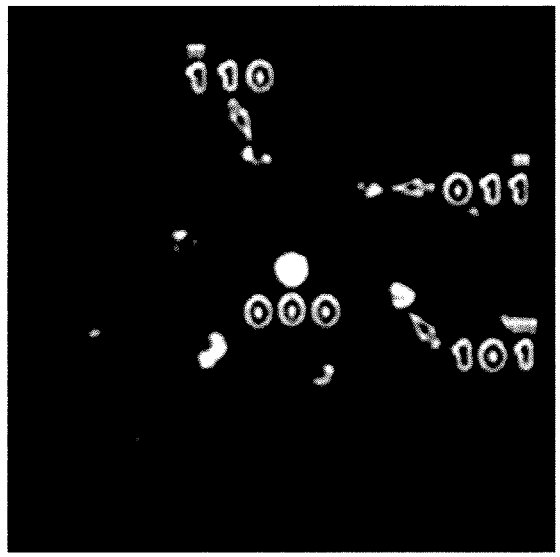
FIG. 5 is a view showing an electron diffraction pattern of the modified phase 2 in FIG. 2.

FIG. 5 shows an electron diffraction pattern of the modified phase 2. It is clear from FIG. 5 that the modified phase 2 formed in Example 1 had only a bcc structure.

Examples 2 and 3

To investigate the influence of a gas type in the ion bombardment of metal Cr, a hard-coated tool was produced in the same manner as in Example 1 except for using a mixed gas of a nitrogen gas and an argon gas. The flow rates of a nitrogen gas and an argon gas were 15 sccm and 5 sccm ($N_2$ was 75% by volume of the mixed gas in flow rate ratio) in Example 2, and 10 sccm and 10 sccm (N$_2$ was 50% by volume of the mixed gas in flow rate ratio) in Example 3. The substrate temperatures in Examples 2 and 3 were 742° C. and 739° C., respectively.

Examples 4 and 5

To investigate the influence of bias voltage P2 in the ion bombardment of metal Cr, a hard-coated tool was produced in the same manner as in Example 1 except for changing the bias voltage to −800 V (Example 4) and −600 V (Example 5). Accompanied by decrease in the bias voltage P2, the substrate temperatures in Examples 4 and 5 were changed to 718° C. and 696° C., respectively.

Examples 6 and 7

To investigate the influence of the discharge current of an arc discharge vaporization source in the ion bombardment of metal Cr, a hard-coated tool was produced in the same manner as in Example 1 except for changing the discharge current to 100 A (Example 6) and 150 A (Example 7). Accompanied by the change of the discharge current, the substrate temperatures in Examples 6 and 7 were changed to 735° C. and 752° C., respectively.

Examples 8 to 11

To investigate the influence of the pressure of an atmosphere gas in the ion bombardment of metal Cr, a hard-coated tool was produced in the same manner as in Example 1, except for changing the gas pressure to 2 Pa (Example 8), 1 Pa (Example 9), 0.04 Pa (Example 10), and 0.7 Pa (Example 11). Accompanied by the change of the gas pressure, the substrate temperatures in Examples 8 to 11 were changed to 735° C., 734° C., 741° C. and 738° C., respectively.

Examples 12 to 15

To investigate the influence of the treatment time in the ion bombardment of metal Cr, a hard-coated tool was produced in the same manner as in Example 1, except for changing the treatment time to 10 minutes (Example 12), 5 minutes (Example 13), 20 minutes (Example 14), and 25 minutes (Example 15).

Example 16-1

To investigate the influence of the composition of the hard coating, a hard-coated tool was produced in the same manner as in Example 1 except for changing the target composition to $Al_{80}Cr_{20}$ (atomic %).

Example 16-2

To investigate the influence of the composition of the hard coating, a hard-coated tool was produced in the same manner as in Example 1 except for changing the target composition to $Al_{60}Cr_{40}$ (atomic %).

Example 16-3

To investigate the influence of the composition of the hard coating, a hard-coated tool was produced in the same manner as in Example 1 except for changing the target composition to $Al_{65}Cr_{30}Si_5$ (atomic %).

Example 16-4

To investigate the influence of the composition of the hard coating, a hard-coated tool was produced in the same manner as in Example 1 except for changing the target composition to $Al_{65}Cr_{25}Si_{10}$ (atomic %).

Example 16-5

To investigate the influence of the composition of the hard coating, a hard-coated tool was produced in the same manner as in Example 1 except for changing the target composition to $Al_{60}Cr_{20}Si_{20}$ (atomic %).

Example 16-6

To investigate the influence of the composition of the hard coating, a hard-coated tool was produced in the same manner as in Example 1 except for changing the target composition to $Al_{65}Cr_{25}Ti_{10}$ (atomic %).

Example 16-7

To investigate the influence of the composition of the hard coating, a hard-coated tool was produced in the same manner as in Example 1 except for changing the target composition to $Al_{60}Cr_{20}Ti_{20}$ (atomic %).

Example 17

To investigate the effect of laminating hard coatings (two-layer structure), a hard-coated tool was produced in the same manner as in Example 1, except for changing the layer structure of the target. A hard coating having a composition of $(Al_{70}Cr_{30})N$ (atomic %) and an average thickness of 1.5 μm was first formed using an $Al_{70}Cr_{30}$ target, and a hard coating having a composition of $(Ti_{80}Si_{20})N$ (atomic %) and an average thickness of 1.5 μm was then formed using a target having a composition of $Ti_{80}Si_{20}$ (atomic %).

Example 18

To investigate the effect of laminating hard coatings (two-layer structure), a hard-coated tool was produced in the same manner as in Example 1 except for changing the layer structure of the target. A hard coating having a composition of $(Al_{70}Cr_{30})N$ (atomic %) and an average thickness of 1.5 μm was first formed using an $Al_{70}Cr_{30}$ target, and a hard coating having a composition of $(Cr_{90}Si_5B_5)N$ (atomic %) and an average thickness of 1.5 μm was then formed using a target having a composition of $Cr_{90}Si_5B_5$ (atomic %).

Examples 19 and 20

To investigate the influence of a metal target composition in the ion bombardment step, a hard-coated tool was produced in the same manner as in Example 1, except for changing the target composition (atomic %) to $Cr_{90}V_{10}$ (Example 19) and $Cr_{95}Mn_5$ (Example 20).

Comparative Example 1

To investigate the influence of a gas type in the ion bombardment of metal Cr, a hard-coated tool was produced in the same manner as in Example 1 except for changing the atmosphere gas to an argon gas alone.

Comparative Example 2

A hard-coated tool was produced in the same manner as in Example 1, except for changing the atmosphere in the ion bombardment step of metal Cr to vacuum (pressure: 0.006 Pa).

Comparative Example 3

Tracing Experiment 1 of JP 2009-220260 A
To evaluate the influence of a bombarded metal (Em/Ew) on adhesion strength in the metal ion bombardment step, a hard-coated tool was produced in the same manner as in Example 1, except for using a target of 100 atomic % Ti (hereinafter referred to as $Ti_{100}$ target) as a bombarded metal. This production condition corresponded to Samples 16 to 19 in Table 1 of JP 2009-220260 A with the atmosphere of $N_2/H_2=90/10$ changed to 100% $N_2$, and the $Ti_{100}$ target used for ion bombardment.

Conventional Example 1

Tracing Experiment 2 of JP 2009-220260 A
Using a target of 100 atomic % Ti (hereinafter referred to as $Ti_{100}$ target) as an arc discharge vaporization source, metal Ti was ion-bombarded onto the same WC-based cemented carbide substrate as in Example 1 for 10 minutes, with a mixed gas of an argon gas and a hydrogen gas at a volume ratio of 90:10 flowing at a flow rate of 20 sccm, the discharge current of the arc discharge vaporization source being 120 A, and the bias voltage being −1000 V. Using an $Al_{70}Cr_{30}$ target, a hard coating having a composition of $(Al_{70}Cr_{30})N$ (atomic %) and an average thickness of 3.0 μm was formed on the ion-bombarded substrate. The X-ray diffraction pattern of the resultant hard-coated tool surface is shown in FIG. 1. As is clear from FIG. 1, this hard-coated tool had X-ray diffraction peaks of a decarburized phase.

Conventional Example 2

Figure 6:
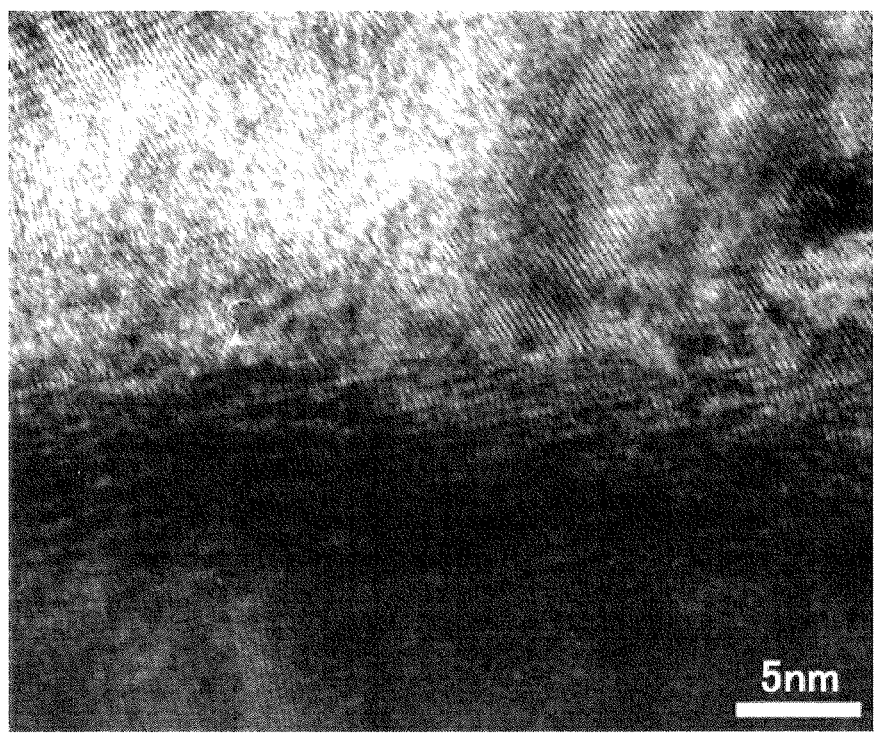
FIG. 6 is a TEM photograph showing a cross section including an interface of the hard-coated tool of Conventional Example 2.
Figure 7:
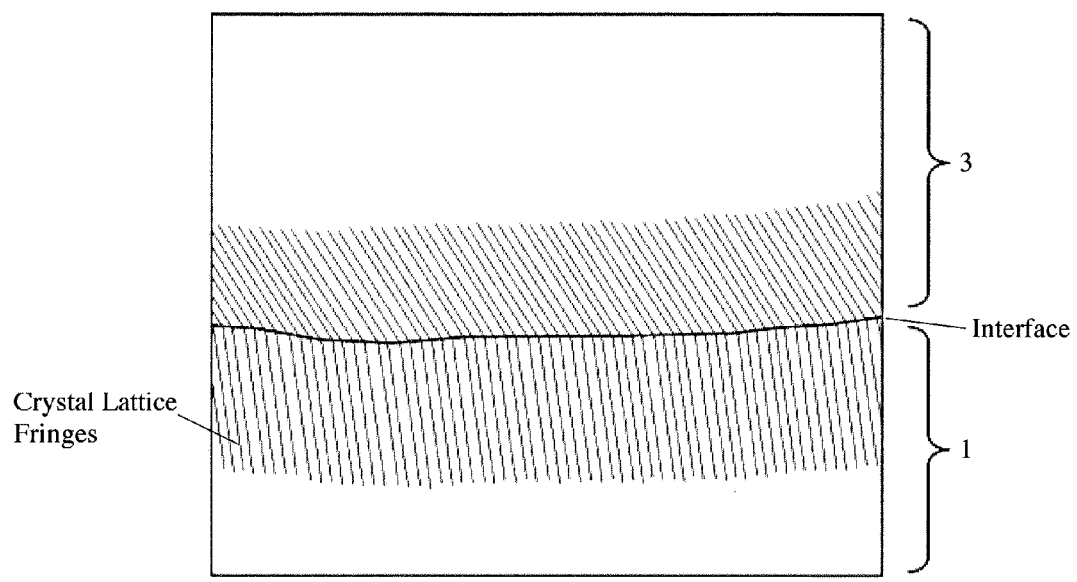
FIG. 7 is a schematic view corresponding to the TEM photograph of FIG. 6.
Figure 8:
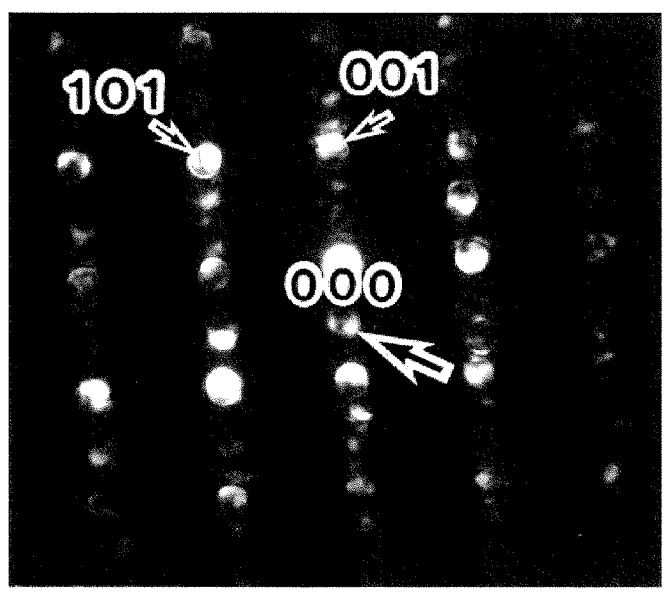
FIG. 8 is a view showing an electron diffraction pattern of an interface between the substrate and the hard coating in FIG. 6.

Tracing Experiment of Japanese Patent 4535249
Using a target of 100 atomic % Cr (hereinafter referred to as $Cr_{100}$ target) as an arc discharge vaporization source, metal Cr was ion-bombarded at discharge current of 100 A and bias voltage of −800 V in vacuum (pressure: 0.006 Pa) for 5 minutes. Using a target having a composition of $Ti_{50}Al_{50}$ (atomic %), a hard coating having a composition of $(Ti_{50}Al_{50})N$ (atomic %) and an average thickness of 3.0 μm was then formed. A TEM photograph of an interface between the substrate and the hard coating in the resultant hard-coated tool is shown in FIG. 6, and the crystal lattice fringes in the interface are schematically shown in FIG. 7. It is clear from FIGS. 6 and 7 that the crystal lattice fringes of the hard coating were bent from those of the substrate in the interface.
FIG. 8 shows an electron diffraction pattern of an interface between the substrate 1 and the hard coating 3 in FIG. 6. It is clear from FIG. 8 that in the hard-coated tool of Conventional Example 2, the hcp structure of WC particles in the substrate 1 and the fcc structure of the hard coating 3 coexisted in the interface, without a modified phase.

Conventional Example 3

Tracing Experiment of Japanese Patent 4590940
Using a $Cr_{100}$ target as an arc discharge vaporization source, metal Cr was ion-bombarded at discharge current of 80 A and bias voltage of −1000 V in vacuum (pressure: 0.006 Pa) for 5 minutes. Using a target having a composition of $Ti_{50}Al_{40}Si_{10}$ (atomic %), a hard coating having a composition of $(Ti_{50}Al_{40}Si_{10})N$ (atomic %) and an average thickness of 3.0 μm was then formed.

Conventional Example 4

To investigate the effect of ion bombardment, a hard-coated tool was obtained in the same manner as in Example 1 except that ion bombardment was not conducted. This corresponds to a hard-coated tool subjected to a conventional gas bombardment treatment.
With respect to Examples 1 to 20, Comparative Examples 1 to 3 and Conventional Examples 1 to 4, the metal ion bombardment conditions are shown in Table 1.

TABLE 1

| | Metal Ion Bombardment Conditions | | | |
|---|---|---|---|---|
| No. | Target (% by mass) | Gas Type | Flow Rate (sccm) | Substrate Temperature (° C.) |
| Example 1 | $Cr_{100}$ | $N_2$ | 20 | 744 |
| Example 2 | $Cr_{100}$ | $N_2$ + Ar | 15/5 | 742 |
| Example 3 | $Cr_{100}$ | $N_2$ + Ar | 10/10 | 739 |
| Example 4 | $Cr_{100}$ | $N_2$ | 20 | 718 |
| Example 5 | $Cr_{100}$ | $N_2$ | 20 | 696 |
| Example 6 | $Cr_{100}$ | $N_2$ | 20 | 735 |
| Example 7 | $Cr_{100}$ | $N_2$ | 20 | 752 |
| Example 8 | $Cr_{100}$ | $N_2$ | 600 | 735 |
| Example 9 | $Cr_{100}$ | $N_2$ | 280 | 734 |
| Example 10 | $Cr_{100}$ | $N_2$ | 15 | 741 |
| Example 11 | $Cr_{100}$ | $N_2$ | 200 | 738 |
| Example 12 | $Cr_{100}$ | $N_2$ | 20 | 725 |
| Example 13 | $Cr_{100}$ | $N_2$ | 20 | 706 |
| Example 14 | $Cr_{100}$ | $N_2$ | 20 | 750 |
| Example 15 | $Cr_{100}$ | $N_2$ | 20 | 755 |
| Example 16-1 | $Cr_{100}$ | $N_2$ | 20 | 739 |
| Example 16-2 | $Cr_{100}$ | $N_2$ | 20 | 745 |
| Example 16-3 | $Cr_{100}$ | $N_2$ | 20 | 729 |
| Example 16-4 | $Cr_{100}$ | $N_2$ | 20 | 732 |
| Example 16-5 | $Cr_{100}$ | $N_2$ | 20 | 728 |
| Example 16-6 | $Cr_{100}$ | $N_2$ | 20 | 737 |
| Example 16-7 | $Cr_{100}$ | $N_2$ | 20 | 743 |
| Example 17 | $Cr_{100}$ | $N_2$ | 20 | 735 |
| Example 18 | $Cr_{100}$ | $N_2$ | 20 | 733 |
| Example 19 | $Cr_{90}V_{10}$ | $N_2$ | 20 | 729 |
| Example 20 | $Cr_{95}Mn_5$ | $N_2$ | 20 | 719 |
| Com. Ex.[(1)] 1 | $Cr_{100}$ | Ar | 20 | 689 |
| Com. Ex. 2 | $Cr_{100}$ | — | — | 675 |
| Com. Ex. 3 | $Ti_{100}$ | $N_2$ | 20 | 843 |
| Conv. Ex.[(2)] 1 | $Ti_{100}$ | Ar + $H_2$ | 18/2 | 825 |
| Conv. Ex. 2 | $Cr_{100}$ | — | — | 684 |
| Conv. Ex. 3 | $Cr_{100}$ | — | — | 694 |
| Conv. Ex. 4 | — | — | — | — |

| | Metal Ion Bombardment Conditions | | | |
|---|---|---|---|---|
| No. | Pressure (Pa) | Discharge Current (A) | Bias Voltage (V) | Treatment Time (minute) |
| Example 1 | 0.08 | 120 | −1000 | 15 |
| Example 2 | 0.08 | 120 | −1000 | 15 |
| Example 3 | 0.08 | 120 | −1000 | 15 |
| Example 4 | 0.08 | 120 | −800 | 15 |
| Example 5 | 0.08 | 120 | −600 | 15 |
| Example 6 | 0.08 | 100 | −1000 | 15 |
| Example 7 | 0.08 | 150 | −1000 | 15 |
| Example 8 | 2 | 120 | −1000 | 15 |
| Example 9 | 1 | 120 | −1000 | 15 |
| Example 10 | 0.04 | 120 | −1000 | 15 |
| Example 11 | 0.7 | 120 | −1000 | 15 |
| Example 12 | 0.08 | 120 | −1000 | 10 |
| Example 13 | 0.08 | 120 | −1000 | 5 |
| Example 14 | 0.08 | 120 | −1000 | 20 |
| Example 15 | 0.08 | 120 | −1000 | 25 |

TABLE 1-continued

| | | | | |
|---|---|---|---|---|
| Example 16-1 | 0.08 | 120 | −1000 | 15 |
| Example 16-2 | 0.08 | 120 | −1000 | 15 |
| Example 16-3 | 0.08 | 120 | −1000 | 15 |
| Example 16-4 | 0.08 | 120 | −1000 | 15 |
| Example 16-5 | 0.08 | 120 | −1000 | 15 |
| Example 16-6 | 0.08 | 120 | −1000 | 15 |
| Example 16-7 | 0.08 | 120 | −1000 | 15 |
| Example 17 | 0.08 | 120 | −1000 | 15 |
| Example 18 | 0.08 | 120 | −1000 | 15 |
| Example 19 | 0.08 | 120 | −1000 | 15 |
| Example 20 | 0.08 | 120 | −1000 | 15 |
| Com. Ex.[1] 1 | 0.08 | 120 | −1000 | 15 |
| Com. Ex. 2 | 0.006 | 120 | −1000 | 15 |
| Com. Ex. 3 | 0.08 | 120 | −1000 | 15 |
| Conv. Ex.[2] 1 | 0.08 | 120 | −1000 | 10 |
| Conv. Ex. 2 | 0.006 | 100 | −800 | 5 |
| Conv. Ex. 3 | 0.006 | 80 | −1000 | 5 |
| Conv. Ex. 4 | — | — | — | — |

Note:
[1]Comparative Example.
[2]Conventional Example.

The modified phase was identified by nano-area electron diffraction at a camera length of 50 cm and a beam diameter of 1-3 nm using TEM, with its composition analyzed by a UTW-type Si (Li) semiconductor detector (available from Nolan) attached to a field emission transmission electron microscope (JEM-2100F available from JEOL Ltd.), and its crystal structure analyzed by TEM. The crystal structure and composition of the modified phase in each Example are shown in Table 2 together with those of the substrate before ion bombardment. In Comparative Examples 1 and 2 and Conventional Examples 2 to 4 each having no modified phase, analysis results near the substrate surfaces are shown in Table 2.

TABLE 2

| | Modified Phase | | | | | | |
|---|---|---|---|---|---|---|---|
| | Crystal | Composition (% by mass) | | | | | |
| No. | Structure | Cr | V | Mn | Co | W | Ti |
| Before Treatment | hcp[1] | 0.0 | 0.0 | 0.0 | 8.5 | 91.5 | 0.0 |
| Example 1 | bcc | 14.1 | 0.0 | 0.0 | 0.3 | 85.6 | 0.0 |
| Example 2 | bcc | 13.7 | 0.0 | 0.0 | 0.3 | 86.0 | 0.0 |
| Example 3 | bcc | 12.9 | 0.0 | 0.0 | 0.4 | 86.7 | 0.0 |
| Example 4 | bcc | 12.7 | 0.0 | 0.0 | 0.3 | 87.0 | 0.0 |
| Example 5 | bcc | 12.2 | 0.0 | 0.0 | 0.5 | 87.3 | 0.0 |
| Example 6 | bcc | 13.8 | 0.0 | 0.0 | 0.4 | 85.8 | 0.0 |
| Example 7 | bcc | 14.3 | 0.0 | 0.0 | 0.3 | 85.4 | 0.0 |
| Example 8 | bcc | 9.7 | 0.0 | 0.0 | 0.4 | 89.9 | 0.0 |
| Example 9 | bcc | 11.1 | 0.0 | 0.0 | 0.5 | 88.4 | 0.0 |
| Example 10 | bcc | 9.4 | 0.0 | 0.0 | 0.5 | 90.1 | 0.0 |
| Example 11 | bcc | 11.7 | 0.0 | 0.0 | 0.4 | 87.9 | 0.0 |
| Example 12 | bcc | 13.4 | 0.0 | 0.0 | 0.5 | 86.1 | 0.0 |
| Example 13 | bcc | 11.7 | 0.0 | 0.0 | 0.6 | 87.7 | 0.0 |
| Example 14 | bcc | 14.5 | 0.0 | 0.0 | 0.3 | 85.2 | 0.0 |
| Example 15 | bcc | 14.8 | 0.0 | 0.0 | 0.3 | 84.9 | 0.0 |
| Example 16-1 | bcc | 14.1 | 0.0 | 0.0 | 0.5 | 85.4 | 0.0 |
| Example 16-2 | bcc | 14.0 | 0.0 | 0.0 | 0.4 | 85.6 | 0.0 |
| Example 16-3 | bcc | 13.9 | 0.0 | 0.0 | 0.4 | 85.7 | 0.0 |
| Example 16-4 | bcc | 13.8 | 0.0 | 0.0 | 0.4 | 85.8 | 0.0 |
| Example 16-5 | bcc | 14.0 | 0.0 | 0.0 | 0.4 | 85.6 | 0.0 |
| Example 16-6 | bcc | 14.1 | 0.0 | 0.0 | 0.4 | 85.5 | 0.0 |
| Example 16-7 | bcc | 14.0 | 0.0 | 0.0 | 0.4 | 85.6 | 0.0 |
| Example 17 | bcc | 14.4 | 0.0 | 0.0 | 0.3 | 85.3 | 0.0 |
| Example 18 | bcc | 14.2 | 0.0 | 0.0 | 0.3 | 85.5 | 0.0 |
| Example 19 | bcc | 13.5 | 0.2 | 0.0 | 0.5 | 85.8 | 0.0 |
| Example 20 | bcc | 12.9 | 0.0 | 0.1 | 0.0 | 87.0 | 0.0 |
| Com. Ex.[1] 1 | hcp[3] | 7.8 | 0.0 | 0.0 | 0.6 | 91.6 | 0.0 |
| Com. Ex. 2 | hcp[3] | 7.0 | 0.0 | 0.0 | 0.5 | 92.5 | 0.0 |
| Com. Ex. 3 | bcc + fcc[4] | 0.0 | 0.0 | 0.0 | 0.2 | 96.1 | 3.7 |
| Conv. Ex.[2] 1 | bcc + fcc[4] | 0.0 | 0.0 | 0.0 | 0.3 | 97.0 | 2.7 |
| Conv. Ex. 2 | hcp[3] | 5.7 | 0.0 | 0.0 | 0.7 | 93.6 | 0.0 |
| Conv. Ex. 3 | hcp[3] | 6.1 | 0.0 | 0.0 | 0.6 | 93.3 | 0.0 |
| Conv. Ex. 4 | hcp[3] | —[5] | —[5] | —[5] | —[5] | —[5] | —[5] |

Note:
[1]Comparative Example.
[2]Conventional Example.
[3]Having no modified phase, with the crystal structure derived from WC in the substrate.
[4]Including the crystal structure of a carbide phase formed on the modified phase.
[5]Having no modified phase.

As is clear from Table 2, any of the modified phases in Examples 1 to 20 had only a bcc structure, while the modified phases in Comparative Examples 3 and Conventional Example 1 had a mixed structure of a bcc structure and an fcc structure, and the modified phases were not formed in Comparative Examples 1 and 2 and Conventional Examples 2 to 4, with the hcp structure derived from WC in the substrate observed. Incidentally, the fcc structure was derived from a carbide phase formed immediately on the modified phase.

As is clear from Table 2, the modified phases formed by the ion bombardment of metal Cr or Cr alloys in Examples 1 to 20 contained Cr, Co and W. The comparison of Examples 1 to 20 with the substrate before the treatment has revealed that as Cr was introduced by ion bombardment, the W content decreased slightly, and the Co content decreased drastically. Ta was not detected in the substrate. Though C was confirmed by qualitative analysis after the ion bombardment, the measured C content was so unstable that accurate quantitative analysis of C failed. Accordingly, the composition of the modified phase is expressed by the composition of metal components. In Examples 19 and 20 using Cr alloy targets, other components than Cr were slightly contained in the modified phase. In the modified phases in Comparative Example 3 and Conventional Example 1, as Ti was introduced by the ion bombardment, the W content increased, while the Co content decreased.

Though the modified phase in each of Examples 1 to 20 had only a bcc structure, the modified phase is not restricted only to a bcc structure, but what is needed to obtain the effect of the present invention is that the modified phase has a bcc structure as a main structure. The percentage of the bcc structure in the modified phase crystal structure is preferably 70% or more.

To confirm whether or not the tools of Examples 1 to 20, Comparative Examples 1 to 3 and Conventional Examples 1 to 4 had decarburized phases, X-ray diffraction analysis was conducted under the conditions below, using an X-ray diffraction apparatus (RU-200 BH available from Rigaku Corporation).

X-ray source: Cukα1 rays (wavelength λ: 0.15405 nm),
Incident angle of X-ray: 5°,
Incident slit of X-ray: 0.4 mm,
Tube voltage: 40 kV,
Tube current: 120 mA, and
2θ: 20-70°.

By X-ray diffraction analysis under the above conditions, a peak of a decarburized phase, if any, is detected in the vicinity of 40° to 41°. Though small peaks of a decarburized phase are also detected near 47° and 58°, their identification may be difficult because of low intensity. The absence of the decarburized phase is preferable. When the detection of peaks of the decarburized phase is difficult because the hard coating is thick, the presence of the decarburized phase can be accurately confirmed by the analysis of an interface between the hard coating and the substrate by a transmission electron microscope (TEM). The presence or absence of the decarburized phase in each of Examples, Comparative Examples and Conventional Examples is shown in Table 3.

With respect to the tools of Examples 1 to 20, Comparative Examples 1 to 3 and Conventional Examples 1 to 4, a cutting test was conducted under the conditions below to evaluate the peeling resistance of the hard coating.

Work: Martensitic stainless steel SUS420J2 having hardness HRC of 52,
Cutting depth: 0.1 mm in axial direction, and 0.1 mm in radial direction,
Rotation speed: 10,000 rpm,
Table feed: 680 mm/minute,
Cutting distance: 5 m, and
Cutting liquid: Aqueous liquid.

After the cutting test, the presence or absence of a decarburized phase on a rake surface of each tool and the peeling resistance of the hard coating were evaluated, using a scanning electron microscope (S-4200 available from Hitachi Limited). The peeling resistance of the hard coating was evaluated by a peeled area of the rake surface, which was determined by image-treating a SEM photograph of the rake surface by image analysis software (IMAGE-PRO available from Media Cybernetics). When the peeled area of the hard coating is less than 2000 $\mu m^2$, the hard coating is regarded as having good adhesion strength. The peeled area of each hard coating is shown in Table 3.

TABLE 3

| No. | Composition of Hard Coating (% by mass) | Evaluation Results Decarburized Phase | Peeled Area ($\mu m^2$) |
|---|---|---|---|
| Example 1 | $(Al_{70}Cr_{30})N$ | No | 1093 |
| Example 2 | $(Al_{70}Cr_{30})N$ | No | 1156 |
| Example 3 | $(Al_{70}Cr_{30})N$ | No | 1238 |
| Example 4 | $(Al_{70}Cr_{30})N$ | No | 1276 |
| Example 5 | $(Al_{70}Cr_{30})N$ | No | 1461 |
| Example 6 | $(Al_{70}Cr_{30})N$ | No | 1439 |
| Example 7 | $(Al_{70}Cr_{30})N$ | No | 1067 |
| Example 8 | $(Al_{70}Cr_{30})N$ | No | 1377 |
| Example 9 | $(Al_{70}Cr_{30})N$ | No | 1350 |
| Example 10 | $(Al_{70}Cr_{30})N$ | No | 1276 |
| Example 11 | $(Al_{70}Cr_{30})N$ | No | 1174 |
| Example 12 | $(Al_{70}Cr_{30})N$ | No | 1443 |
| Example 13 | $(Al_{70}Cr_{30})N$ | No | 1673 |
| Example 14 | $(Al_{70}Cr_{30})N$ | No | 995 |
| Example 15 | $(Al_{70}Cr_{30})N$ | No | 986 |
| Example 16-1 | $(Al_{80}Cr_{20})N$ | No | 1786 |
| Example 16-2 | $(Al_{60}Cr_{40})N$ | No | 1458 |
| Example 16-3 | $(Al_{65}Cr_{30}Si_5)N$ | No | 1597 |
| Example 16-4 | $(Al_{65}Cr_{25}Si_{10})N$ | No | 1267 |
| Example 16-5 | $(Al_{60}Cr_{20}Si_{20})N$ | No | 1321 |
| Example 16-6 | $(Al_{65}Cr_{25}Ti_{10})N$ | No | 1278 |
| Example 16-7 | $(Al_{60}Cr_{20}Ti_{20})N$ | No | 1199 |
| Example 17 | $(Al_{70}Cr_{30})N/(Ti_{80}Si_{20})N$ | No | 1421 |
| Example 18 | $(Al_{70}Cr_{30})N/(Cr_{90}Si_5B_5)N$ | No | 1618 |
| Example 19 | $(Al_{70}Cr_{30})N$ | No | 1187 |
| Example 20 | $(Al_{70}Cr_{30})N$ | No | 1204 |
| Com. Ex.[1] 1 | $(Al_{70}Cr_{30})N$ | No | 6838 |
| Com. Ex. 2 | $(Al_{70}Cr_{30})N$ | No | 5773 |
| Com. Ex. 3 | $(Al_{70}Cr_{30})N$ | Yes | 4017 |
| Conv. Ex.[2] 1 | $(Al_{70}Cr_{30})N$ | Yes | 3694 |
| Conv. Ex. 2 | $(Ti_{50}Al_{50})N$ | No | 7653 |
| Conv. Ex. 3 | $(Ti_{50}Al_{40}Si_{10})N$ | No | 8394 |
| Conv. Ex. 4 | $(Al_{70}Cr_{30})N$ | No | 19146 |

Note:
[1]Comparative Example.
[2]Conventional Example.

As is clear from Tables 1 to 3, each hard-coated tool of Examples 1 to 20 obtained by ion-bombarding metal Cr or an alloy of Cr and V or Mn onto a WC-based cemented carbide substrate under the conditions of a gas pressure of 0.03-2 Pa and a substrate temperature of 650-850° C., in a nitrogen gas, or in a mixed gas of a nitrogen gas and an inert gas, the flow rate of a nitrogen gas being 50% or more of the flow rate of the mixed gas, was free from a decarburized phase, having high adhesion strength to the hard coating. On the other hand, the hard-coated tools of Comparative Examples 1 to 3, which did not meet at least one of the above conditions, suffered the formation of a decarburized phase and/or low adhesion strength to the hard coating.

In Conventional Example 1, in which the ion bombardment was conducted using a metal Ti target in a mixed gas of an Ar gas and a hydrogen gas, the decarburized phase was formed, and the hard coating had a large peeled area (low adhesion strength). In Conventional Examples 2 and 3, in which the ion bombardment was conducted using a metal Cr target in vacuum, the hard coating had extremely low adhesion strength, because the atmosphere did not contain a nitrogen gas, and because the hard coating did not contain the same metal as the bombarded metal. In Conventional Example 4 conducting no ion bombardment, the hard coating had extremely low adhesion strength, because of the lack of a modified layer.

(1) Influence of Ion-Bombarded Metal

As is clear from the comparison of Examples 1, 19 and 20 with Comparative Example 3, the hard-coated tools of Examples 1, 19 and 20 obtained by using targets composed of Cr alone or alloys of Cr and V or Mn (Em/Ew<3) were free from decarburized phases, with their hard coatings having as small peeled areas as 1204 $\mu m^2$ or less (less than 2000 $\mu m^2$), while the hard-coated tool of Comparative Example 3 obtained by using a $Ti_{100}$ target (3<Em/Ew) suffered the formation of a decarburized phase, with its hard coating having as extremely large a peeled area as 4017 $\mu m^2$. These results indicate that the use of an ion-bombarding metal meeting the condition of Em/Ew<3 not only prevents the formation of a decarburized phase, but also provides a hard coating with extremely high adhesion strength, while the failure of meeting the above condition results in the formation of a decarburized phase, with a hard coating having low adhesion strength. High adhesion strength in the hard coatings of Examples 1, 19 and 20 appears to be obtained by the formation of a modified phase having a bcc structure on the WC-based cemented carbide substrate, which contributed to the improvement of adhesion strength.

(2) Influence of Gas Type

As is clear from the comparison of Examples 1 to 3 with Comparative Example 1, the peeled areas of hard coatings were suppressed to 1238 $\mu m^2$ or less (less than 2000 $\mu m^2$) in Examples 1 to 3, in which the ion bombardment of metal Cr was conducted in a nitrogen gas alone, or in a mixed gas of a nitrogen gas and an Ar gas, in which the flow rate ratio by volume of a nitrogen gas was 50% or more, while the peeled area of a hard coating was as extremely large as 6838 μm² in Comparative Example 1, in which the ion bombardment of metal Cr was conducted in an Ar gas. This is due to the fact that the Ar gas used in Comparative Example 1 provides a low plasma density on a metal Cr target during the ion bombardment, unlike the nitrogen gas.

Bias current flowing in the substrate during the ion bombardment was about 18 A in Examples 1 to 3 using an atmosphere composed of a nitrogen gas alone, or a mixed gas of a nitrogen gas and an Ar gas, while it was about 14 A in Comparative Example 1 using an atmosphere composed of an argon gas alone. Because higher bias current leads to a larger amount of Cr ions reaching the substrate (higher ionization efficiency of a target metal), Examples 1 to 3 had higher ionization efficiency and thus higher ion bombardment efficiency than Comparative Example 1. Accordingly, the hard-coated tools of Examples 1 to 3 suffered smaller peeled areas in the hard coatings and thus had longer lives than Comparative Example 1. It is clear from FIGS. 3 and 4 that in Example 1, the crystal lattice of the modified phase was 70% or more continuous with that of the hard coating. The continuity of the crystal lattice appears to improve the adhesion strength of the hard coating.

(3) Influence of Bias Voltage

Figure 10:
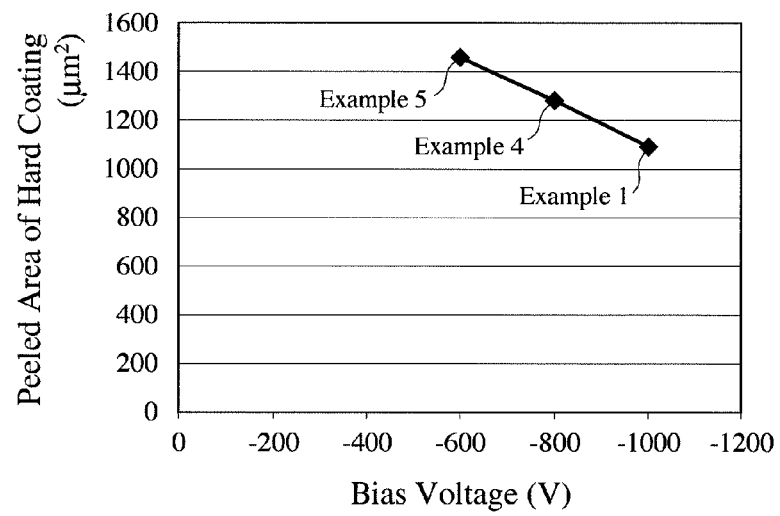
FIG. 10 is a graph showing the relation between bias voltage and a peeled area of the hard coating in Examples 1, 4 and 5.

The relation between bias voltage and a peeled area of the hard coating in Examples 1, 4 and 5 having the same conditions except for the bias voltage is shown in FIG. 10. As is clear from FIG. 10, the peeled areas of the hard coatings in Examples 4 and 5, in which the bias voltage was −800 V and −600 V, respectively, were larger than in Example 1, in which the bias voltage was −1000 V, but any of peeled areas was less than 1500 μm², sufficiently smaller than in Conventional Examples 1 to 4. It is clear from FIG. 10 that a larger absolute value of the bias voltage provides a smaller peeled area of the hard coating (higher adhesion strength). The substrate temperature was 696° C. in Example 5 in which the bias voltage was −600 V, 718° C. in Example 4 in which the bias voltage was −800 V, and 744° C. in Example 1 in which the bias voltage was −1000 V. These results indicate that a larger absolute value of the bias voltage provides metal ions reaching the substrate with higher energy, elevating the substrate temperature, thereby activating the substrate surface.

(4) Influence of Discharge Current

Figure 11:
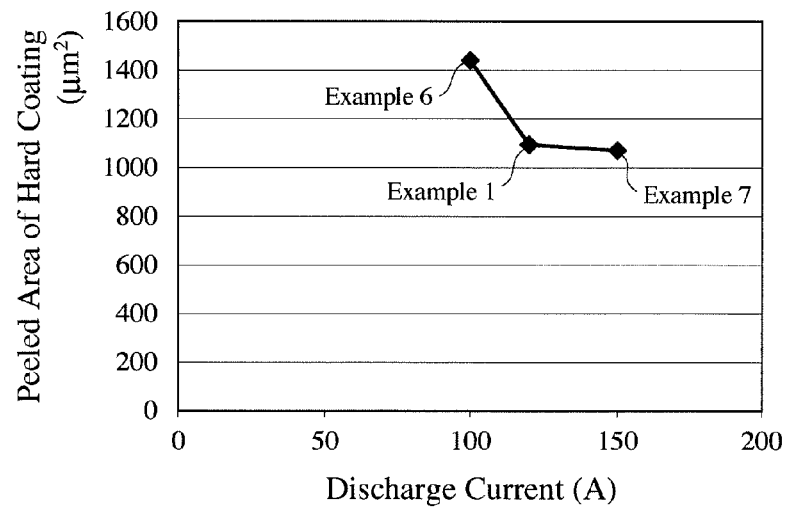
FIG. 11 is a graph showing the relation between discharge current and a peeled area of the hard coating in Examples 1, 6 and 7.

With respect to the hard-coated tools of Examples 1, 6 and 7 produced under the same conditions except for the discharge current of an arc discharge vaporization source, the relation between discharge current and a peeled area of the hard coating is shown in FIG. 11. The discharge current was 120 A, 100 A and 150 A, respectively, in Examples 1, 6 and 7. It is clear from FIG. 11 that any peeled areas were less than 1500 μm², extremely smaller than in Conventional Examples 1 to 4, and decreased as the discharge current increased. The reason why higher discharge current provides the hard coating with a smaller peeled area is that higher discharge current increases Cr ions emitted from the target, resulting in higher ion bombardment efficiency.

(5) Influence of Gas Pressure

Figure 12:
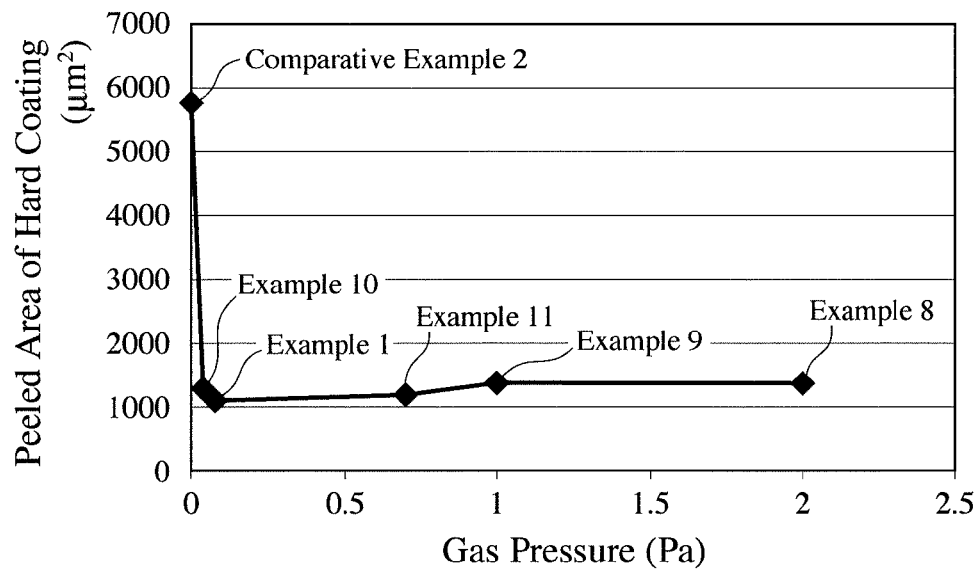
FIG. 12 is a graph showing the relation between gas pressure and a peeled area of the hard coating in Examples 1 and 8 to 11 and Comparative Example 2.

With respect to the hard-coated tools of Examples 1 and 8 to 11 and Comparative Example 2 produced under the same conditions except for the pressure of an atmosphere gas, the relation between gas pressure and a peeled area of the hard coating is shown in FIG. 12. The gas pressure was 0.08 Pa, 2 Pa, 1 Pa, 0.04 Pa, 0.7 Pa, and 0.006 Pa, respectively, in Examples 1 and 8 to 11 and Comparative Example 2. It is clear from FIG. 12 that in Examples 1, 8, 9 and 11, lower atmosphere gas pressures provided the hard coatings with smaller peeled areas. This appears to be due to the fact that a larger amount of a gas for higher pressure caused gas molecules existing in the film-forming apparatus to prevent metal ions from reaching the substrate.

Among Examples 1 and 8 to 11, Example 10 had the lowest gas pressure, with slight increase in the peeled area of the hard coating. This appears to be due to the fact that a lower flow rate of a nitrogen gas decreased the ionization efficiency of metal Cr. Accordingly, in Comparative Example 2 conducted in vacuum (gas pressure: 0.006 Pa), the peeled area of the hard coating was as extremely large as 5773 μm².

(6) Influence of Ion Bombardment Time

Figure 13:
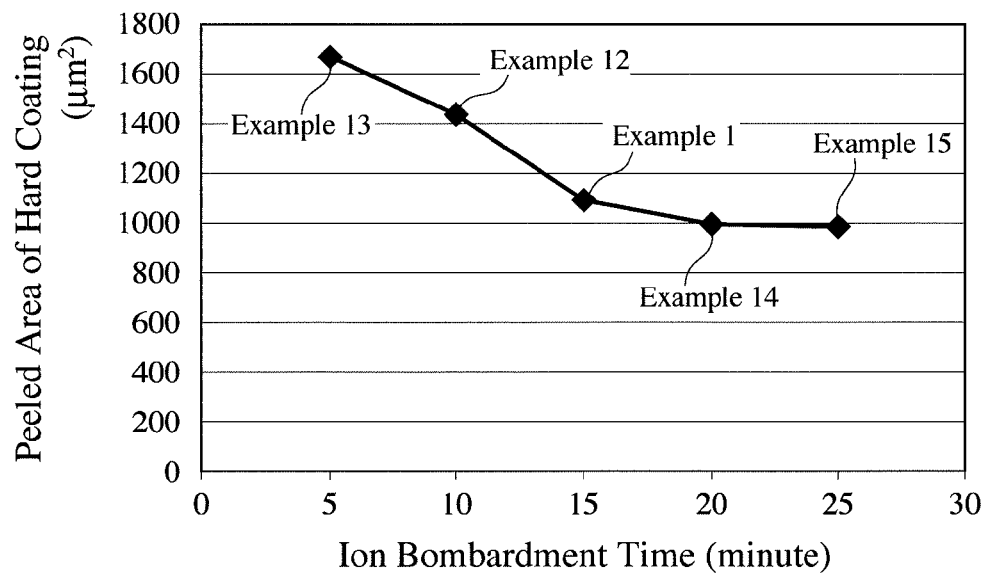
FIG. 13 is a graph showing the relation between ion bombardment time and a peeled area of the hard coating in Examples 1 and 12 to 15.

With respect to the hard-coated tools of Examples 1 and 12 to 15 produced under the same conditions except for the ion bombardment time, the relation between the ion bombardment time and a peeled area of the hard coating is shown in FIG. 13. The ion bombardment time was 15 minutes, 10 minutes, 5 minutes, 20 minutes, and 25 minutes, respectively, in Examples 1 and 12 to 15. It is clear from FIG. 13 that a longer ion bombardment time provided the hard coatings with smaller peeled areas. This appears to be due to the fact that a shorter ion bombardment time formed thinner modified phases. The average thickness of the modified phase was about 5 nm in 5 minutes (Example 13), about 7 nm in 10 minutes (Example 12), and about 10 nm in 15 minutes (Example 1).

Though the ion bombardment time was variable depending on a substrate size, the effect of reducing the peeled area of the hard coating was saturated when the ion bombardment time was 15 minutes or more, in a two-flute ball end mill of WC-based cemented carbide shown in FIG. 9, which had a ball radius R of 1.0 mm and an under-neck length L of 10 mm. This appears to be due to the fact that a longer ion bombardment time provides less change to the substrate temperature, so that the thickness of the modified phase is substantially unchanged.

(7) Influence of Hard Coating Composition

To evaluate the influence of a hard coating composition on the adhesion strength of the hard coating, the hard-coated tools of Examples 16-1 to 18 were produced under the same conditions as in Example 1 except for the hard coating composition as shown in Table 3. The hard coatings of Examples 16-1 to 18 were $(Al_{80}Cr_{20})N$, $(Al_{60}Cr_{40})N$, $(Al_{65}Cr_{30}Si_5)N$, $(Al_{65}Cr_{25}Si_{10})N$, $(Al_{60}Cr_{20}Si_{20})N$, $(Al_{65}Cr_{25}Ti_{10})N$, $(Al_{60}Cr_{20}Ti_{20})N$, a two-layer structure of $(Al_{70}Cr_{30})N/(Ti_{80}Si_{20})N$, and a two-layer structure of $(Al_{70}Cr_{30})N/(Cr_{90}Si_5B_5)N$, respectively. Though the hard-coated tools of Examples 16-1 to 18 provided the hard coatings with larger peeled areas than in Example 1, any of them was less than 2000 μm², extremely smaller than in Conventional Examples 1 to 4. This appears to be due to the fact that as in Example 1, the hard coatings of Examples 16-1 to 18 contained Cr, the same component as in the modified phases, thereby improving the adhesion strength of the substrate/the modified phase/the hard coating.

EFFECTS OF THE INVENTION

The modified phase formed on a WC-based cemented carbide substrate by the ion bombardment of Cr or Cr alloys (containing at least one element selected from the group consisting of V, Ni, Fe and Mn) in a nitrogen gas, or in a mixed gas of a nitrogen gas and an inert gas, has a bcc structure, and crystal lattice fringes at least partially continuous with those of the substrate. The formation of the modified phase is not accompanied by the formation of a decarburization layer. Accordingly, the modified phase has large adhesion strength to the substrate. Further, because the modified phase and the hard coating contain common elements, and because the crystal lattice fringes of the modified phase are at least partially continuous with those of the hard coating, the hard-coated, WC-based cemented carbide member of the present invention comprising the hard coating formed on the WC-based cemented carbide substrate via the modified phase has larger adhesion strength to the hard coating and thus a longer life than conventional ones. The hard-coated, WC-based cemented carbide members of the present invention having such feature are suitable for hard-coated tools required to have excellent coating adhesion, and can be widely used as tools for cutting high-hardness steel, stainless steel, cast steel, etc.

What is claimed is:

1. A hard-coated, WC-based cemented carbide member comprising a hard coating containing at least Cr, which is formed on a WC-based cemented carbide substrate via a modified phase having a bcc structure, said modified phase having a metal composition represented except for inevitable impurities by the following general formula:

$$W_{100-x-y}M_xCo_y (\% \text{ by mass}),$$

wherein M is at least one element selected from the group consisting of Cr, V, Ni, Fe and Mn, Cr being indispensable and occupying 70% or more by mass of the entire element M, and (100-x-y), x and y expressing the amounts (% by mass) of W, said element M and Co are numbers meeting the conditions of $80 \leq 100-x-y \leq 95$, $5 \leq x \leq 20$, and $0.1 \leq y \leq 3$, respectively.

2. The hard-coated, WC-based cemented carbide member according to claim 1, wherein said hard coating contains Cr, Al and N.

3. The hard-coated, WC-based cemented carbide member according to claim 1, wherein the crystal lattice fringes of said substrate are at least partially continuous with those of said modified phase in their interface.

4. The hard-coated, WC-based cemented carbide member according to claim 1, wherein said element M is only Cr.

5. The hard-coated, WC-based cemented carbide member according to claim 1, which is a cutting tool.

6. A method for producing a hard-coated, WC-based cemented carbide member, which comprises (1) ion-bombarding an element M, which is at least one element selected from the group consisting of Cr, V, Ni, Fe and Mn, Cr being indispensable and occupying 70% or more by mass of the entire element M, onto a surface of said WC-based cemented carbide substrate, in a nitrogen gas, or in a mixed gas of a nitrogen gas and an inert gas, the flow rate of the nitrogen gas being 50% or more of that of the mixed gas, under such conditions that the pressure of said gas is 0.03-2 Pa, that bias voltage applied to said substrate is -1500 V to -600 V, and that the temperature of said substrate is 650-850° C., thereby producing a surface-modified, WC-based cemented carbide member provided with a modified phase having a bcc structure, and (2) forming a hard coating containing at least Cr on a surface of said modified phase.

7. The method for producing a hard-coated, WC-based cemented carbide member according to claim 6, wherein said hard coating contains Cr, Al and N.

8. The method for producing a hard-coated, WC-based cemented carbide member according to claim 6, wherein the carbide-forming free energy Em of said element M and the carbide-forming free energy Ew of W meet the condition of Em/Ew<3 at 800° C.

* * * * *